(12) United States Patent
Chou et al.

(10) Patent No.: US 11,819,923 B2
(45) Date of Patent: Nov. 21, 2023

(54) CONDUCTIVE POWDER FORMATION METHOD AND DEVICE FOR FORMING CONDUCTIVE POWDER

(71) Applicant: TAIWAN SEMICONDUCTOR MANUFACTURING COMPANY, LTD., Hsinchu (TW)

(72) Inventors: You-Hua Chou, Hsinchu (TW); Kuo-Sheng Chuang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 442 days.

(21) Appl. No.: 16/943,839

(22) Filed: Jul. 30, 2020

(65) Prior Publication Data

US 2020/0357694 A1 Nov. 12, 2020

Related U.S. Application Data

(62) Division of application No. 15/489,894, filed on Apr. 18, 2017, now Pat. No. 10,763,165.

(51) Int. Cl.
*B22F 9/28* (2006.01)
*B22F 1/0545* (2022.01)
*H01L 21/768* (2006.01)
*H01L 21/288* (2006.01)
(Continued)

(52) U.S. Cl.
CPC ............ *B22F 9/28* (2013.01); *C23C 16/0281* (2013.01); *C23C 16/26* (2013.01); *H01L 21/288* (2013.01); *H01L 21/76843* (2013.01);
*H01L 21/76871* (2013.01); *H01L 21/76877* (2013.01); *H01L 21/76882* (2013.01); *H01L 21/76883* (2013.01); *B22F 1/0545* (2022.01)

(58) Field of Classification Search
None
See application file for complete search history.

(56) References Cited

U.S. PATENT DOCUMENTS 5,277,740 A * 1/1994 Yoneda ............ H01L 21/67069
204/298.31
5,788,738 A * 8/1998 Pirzada ................. C01B 19/007
75/331

(Continued)

FOREIGN PATENT DOCUMENTS

CN 101160166 4/2008
CN 101450384 6/2009
(Continued)

OTHER PUBLICATIONS

Office Action dated Jul. 6, 2020 from corresponding application No. TW 106121827.

(Continued)

*Primary Examiner* — Jose I Hernandez-Kenney
(74) *Attorney, Agent, or Firm* — Hauptman Ham, LLP (57) ABSTRACT

A method of forming a conductive powder includes reducing, by a reduction reaction, a conductive powder precursor gas using a plasma to form the conductive powder. The method further includes filtering the conductive powder based on particle size. The method further includes dispersing a portion of the conductive powder having a particle size below a threshold value in a fluid.

19 Claims, 8 Drawing Sheets

(51) Int. Cl.
*C23C 16/02* (2006.01)
*C23C 16/26* (2006.01)

(56) References Cited

U.S. PATENT DOCUMENTS

| | | | |
|---|---|---|---|
| 6,254,940 B1* | 7/2001 | Pratsinis | C01B 13/24 |
| | | | 423/625 |
| 7,262,384 B2* | 8/2007 | Jackson | B22F 9/28 |
| | | | 219/121.36 |
| 7,696,062 B2 | 4/2010 | Chang-Chien et al. | |
| 2002/0184971 A1 | 12/2002 | Myrick | |
| 2003/0201427 A1 | 10/2003 | Tori et al. | |
| 2008/0173131 A1* | 7/2008 | Withers | B22F 9/28 |
| | | | 75/370 |
| 2009/0029148 A1* | 1/2009 | Hashimoto | B22F 9/24 |
| | | | 977/773 |
| 2009/0181226 A1* | 7/2009 | Ning | H05K 3/1258 |
| | | | 428/209 |
| 2013/0206461 A1 | 8/2013 | Sullivan Malervy et al. | |
| 2013/0217226 A1 | 8/2013 | Kitamura et al. | |
| 2013/0256650 A1 | 10/2013 | Yang et al. | |
| 2014/0138846 A1 | 5/2014 | Blanchard | |
| 2015/0008589 A1 | 1/2015 | Suzuki | |
| 2016/0115571 A1 | 4/2016 | Kestler | |
| 2017/0229301 A9 | 8/2017 | Kitamura | |
| 2018/0249581 A1 | 8/2018 | Mamezaki | |
| 2019/0358708 A1* | 11/2019 | Mariotti | B22F 1/056 |

FOREIGN PATENT DOCUMENTS

| | | |
|---|---|---|
| CN | 101491166 | 7/2009 |
| CN | 101678461 | 3/2010 |
| CN | 102632249 | 8/2012 |
| CN | 103887703 | 6/2014 |
| CN | 105632910 | 6/2016 |
| JP | 61244048 A | 10/1986 |
| JP | S62152532 | 7/1987 |
| JP | H0625717 | 2/1994 |
| JP | 2004359979 | 12/2004 |
| JP | 2004359979 A * | 12/2004 |
| TW | I295807 | 4/2008 |
| TW | 201016343 | 5/2010 |
| TW | I574327 B | 3/2017 |
| WO | 0145906 | 6/2001 |

OTHER PUBLICATIONS

Office Action dated Jan. 21, 2022 for corresponding case No. CN 201710525091.4 (pp. 1-12).
Office Action dated Sep. 3, 2021 for corresponding case No. TW 11020864070. (pp. 1-3).

* cited by examiner

CONDUCTIVE POWDER FORMATION METHOD AND DEVICE FOR FORMING CONDUCTIVE POWDER

RELATED APPLICATIONS

This application is a divisional application of U.S. application Ser. No. 15/489,894, filed Apr. 18, 2017, the entire contents of which are hereby incorporated by reference.

BACKGROUND

In semiconductor technology, interconnects are formed on a substrate to electrically connect various active components of a semiconductor device. The interconnects are formed as conductive lines, which extend substantially parallel to a top surface of the substrate, and conductive vias, which electrically connect conductive lines on different metal layers. A metal layer is a group of conductive lines having a same distance from the top surface of the substrate. A group of conductive lines closest to the substrate is often called metal layer zero (M0).

Conductive lines are formed by creating openings in a dielectric material and filling those openings with a conductive material. A planarization process is used to remove excess conductive material following filling of the openings. As critical dimensions of semiconductor devices continue to shrink, filling the openings becomes more challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As technology nodes decrease, effectively filling openings or conductive lines and vias becomes more difficult. Approaches such as sputtering or plating create voids in the conductive lines or vias, in some instances. In addition, approaches like plating increase a carbon content in the conductive lines or vias, in some instances. Voids and increased carbon content reduce reliability of the conductive lines and vias to perform as intended. Filling openings using conductive powders helps to reduce a carbon content in the conductive lines or vias. However, conductive powders having a particle size which is too large in comparison with a size of the openings reduces reliability in effectively filling the openings. By forming a conductive powder which has a small particle size and filling openings for conductive lines or vias in a semiconductor device with the conductive powder, reliability of the semiconductor device and production yield are increased.

Figure 1:
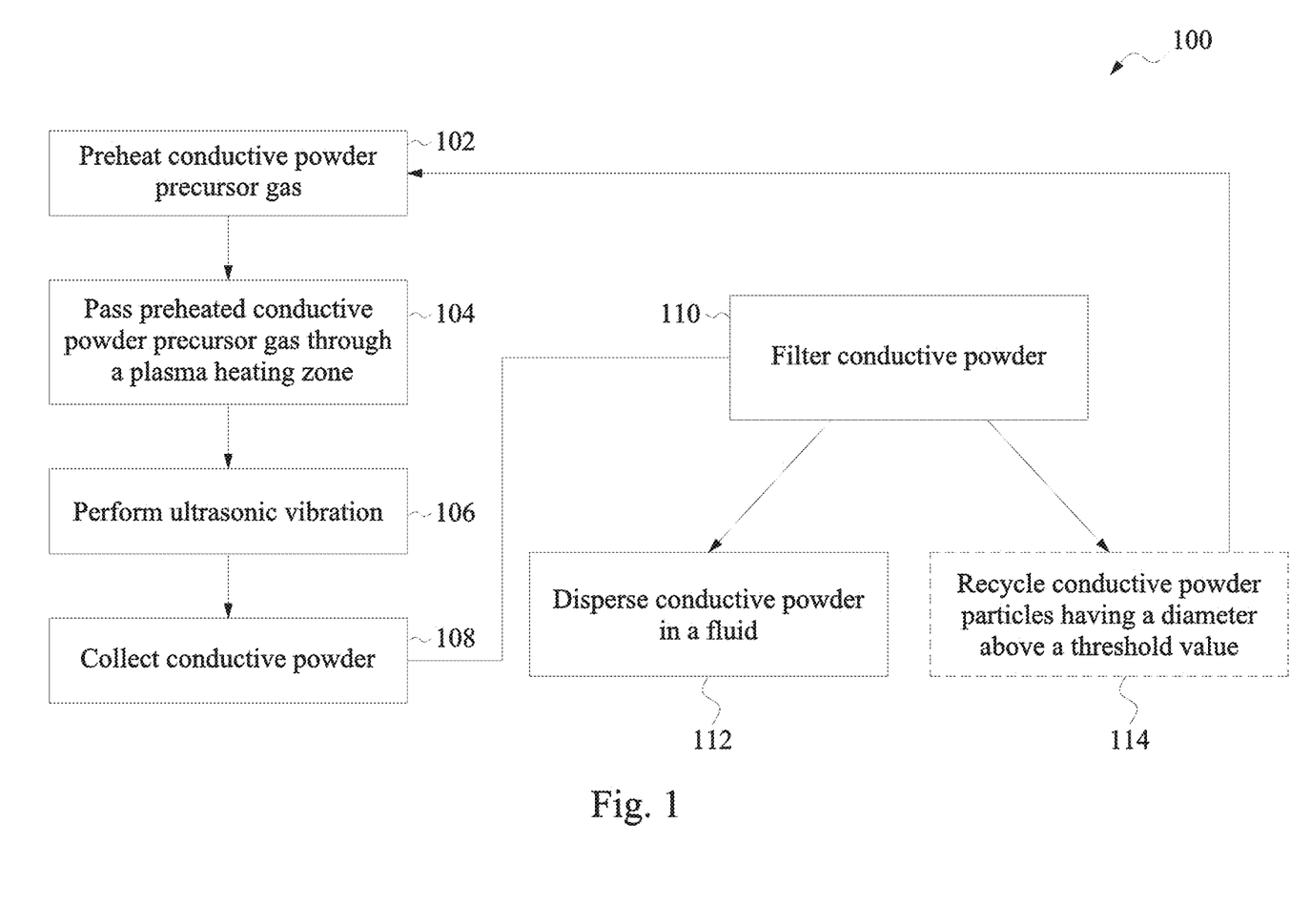
FIG. 1 is a flowchart of a method of forming a conductive powder in accordance with some embodiments.

FIG. 1 is a flow chart of a method 100 of forming a conductive powder according to some embodiments. Method 100 is able to form a conductive powder having an average particle diameter ranging from about 1 nanometer (nm) to about 5 microns (μm). Other approaches for forming a conductive powder which has an average particle diameter of greater than 5 μm are not able to reliably fill openings in dielectric layers at advanced technology nodes, in some instances. As a particle size increases, a risk of voids forming when filling an opening for conductive lines using a conductive powder increases. Voids increase resistance within the conductive line. The increased resistance reduces precision of signal transfer and increases power consumption of the semiconductor device. As critical dimensions for semiconductor devices decreases, a smaller particle size helps to fill openings for interconnects more reliably to reduce occurrence of voids in the conductive lines.

In operation 102, a conductive powder precursor gas is preheated. The conductive powder precursor gas is preheated to a temperature below a decomposition temperature of the conductive powder precursor gas. In some embodiments, the conductive powder precursor gas is heated to a temperature ranging from about 100° C. to about 600° C. If the temperature of the preheated conductive powder precursor gas is too low, reaction times for forming the conductive powder are increased and yield of the conductive powder production process is decreased, in some instances. If the temperature of the preheated conductive powder precursor gas is too high, a risk of decomposition of the preheated conductive powder precursor gas increases and yield of the conductive powder production process decreases, in some instances.

A material of the conductive powder precursor gas depends on a material of a conductive powder to be formed by method 100. In some embodiments, the conductive powder to be formed by method 100 includes aluminum, cobalt, copper, gold, magnesium, nickel, silver, titanium, zinc, alloys thereof or other suitable conductive material. In some embodiments, the conductive powder precursor gas includes a conductive-material organic compound. The conductive-material organic compound includes the material of the conductive powder to be formed by method 100 bonded to at least one methyl group. For example, in some embodiments where the conductive powder to be formed by method 100 is aluminum, the conductive powder precursor gas includes $Al_2(CH_3)_6$. In some embodiments, the conductive powder precursor gas includes a conductive-material halide compound. The conductive-material halide compound includes at least one halogen material bonded to the material of the conductive powder to be formed by method 100. For example, in some embodiments, where the conductive powder to be formed by method 100 is aluminum, the conductive powder precursor gas includes $AlCl_3$. In some embodiments, the conductive powder precursor gas includes more than one compound including a same conductive powder material, for example $Al_2(CH_3)_6$ and $AlCl_3$ are both included as part of the conductive powder precursor gas. In some embodiments, the conductive powder precursor gas includes compounds for forming conductive powders having different materials, for example $Al_2(CH_3)_6$ and $CuCl_2$ are both included as part of the conductive powder precursor gas.

In some embodiments, the conductive powder precursor gas is preheated prior to entering a reaction chamber. In some embodiments, the conductive powder precursor gas is preheated in a portion of the reaction chamber prior to interacting with other materials inside the reaction chamber. In some embodiments, the conductive powder precursor gas is formed by atomizing a liquid using an ejection process. In some embodiments, the conductive powder precursor gas is formed by vaporizing a liquid by heating the liquid.

In operation 104, the preheated conductive powder gas passes through a plasma heating zone. The plasma heating zone includes a plasma having a mixture of a hydrogen plasma and an inert gas plasma. In some embodiments, the inert gas for forming the inert gas plasma includes nitrogen gas, argon, helium or another suitable inert gas. The plasma is ignited prior to interacting with the preheated conductive powder precursor gas. The plasma reacts with the preheated conductive powder gas to remove the organic material or halide material from the conductive powder. The hydrogen plasma within the plasma mixture helps to prevent oxidation of the conductive powder material by reducing, i.e., by a reduction reaction, the conductive powder material.

In some embodiments, the hydrogen and the inert gas enter the reaction chamber by separate input ports. In some embodiments, the hydrogen and the inert gas enter the reaction chamber by a same input port. In some embodiments, a pressure in the reaction chamber during the reaction of the preheated conductive powder precursor gas ranges from about 10 milliTorr (mTorr) to about 20 Torr. The pressure in the reaction chamber helps to determine an amount of reactant materials within the reaction chamber to help control a rate of reaction. A radio frequency (RF) power applied in the reaction chamber depends on a volume of the reaction chamber. As the volume of the reaction chamber increases, the RF power applied in the reaction chamber also increases. In some embodiments, the RF power applied in the reaction chamber ranges from about 10 watts (W) to about 300 kilowatts (kW). The RF power applied helps to ignite the plasma for the plasma mixture. A temperature of the reaction chamber ranges from about 100° C. to about 600° C. The temperature of the reaction chamber is below the decomposition temperature of the conductive powder precursor gas. In some embodiments, the reaction chamber temperature is equal to the temperature of the preheated conductive powder precursor gas. In some embodiments, the temperature of the reaction chamber is greater than the temperature of the preheated conductive powder precursor gas.

The reaction between plasma and the preheated conductive powder precursor gas forms a conductive powder. In some embodiments, using the reaction between the plasma and the preheated conductive powder precursor gas produces a particle distribution where about 95% of the particles have a diameter equal to or less than 5 nm; and about 5% of the particles have a diameter greater than 5 nm.

In operation 106, an ultrasonic vibration is performed on the reaction chamber. The ultrasonic vibration helps to prevent the conductive powder or by-products from adhering and building up on walls of the reaction chamber. The walls of the reaction chamber are coated with graphene to reduce friction between the walls of the reaction chamber and the conductive powder and by-products to help reduce build up on the reaction chamber walls. The combination of the graphene coating and the ultrasonic vibration helps to prolong maintenance cycles for the reaction chamber in order to increase productivity of method 100.

In some embodiments, the ultrasonic vibration is produced by a vibration generator. In some embodiments, the vibration generator includes transducers on an outer surface of the reaction chamber. In some embodiments, the vibration generator includes a gas flowing through a channel or rotating a bearing within a chamber. In some embodiments, operation 106 is performed simultaneously with operation 104.

In operation 108, the conductive powder is collected. The conductive powder is charged because of the plasma reaction. In some embodiments, the conductive powder is collected using an electro-static collector (ESC) to direct the conductive powder into at least one collection cell. In some embodiments, multiple collection cells are arranged parallel with each other. In some embodiments, the ESC is used to help separate the conductive powder based on particle size into different collection cells. As a particle size decreases, the ESC is able to move the conductive powder a greater distance in order to separate the conductive powder into different collection cells. In some embodiments, the conductive powder is collected using a vacuum pump to pull the conductive powder into a collection chamber.

In operation 110, the conductive powder is filtered. The conductive powder is filtered based on particle size. In some embodiments, as discussed above, the collection process helps to filter the conductive powder. In some embodiments, the collection process and the filtering process are performed simultaneously. In some embodiments, a separate filtering process is performed after the collection process.

In some embodiments, the conductive powder is filtered using a centrifugal process. The conductive powder is dispersed in a solvent to form a mixture. The solvent is free of oxygen in order to reduce the risk of oxidation of the conductive powder. In some embodiments, the solvent includes methane, acetone, isopropyl alcohol or another suitable solvent material. The mixture is placed in a centrifuge in order to separate the particles of the conductive powder based on weight. Since a composition of the particles of the conductive powder is substantially uniform amongst the particles, the weight-based separation provided by the centrifugal process is a size-based separation.

In some embodiments, a combination of filtering techniques is used to separate particles of the conductive powder. For example, in some embodiments, both an ESC filtering process and a centrifugal process are used. In some embodiments, a filtering process is repeated. For example, in some embodiments, the centrifugal process is repeated at least twice in order to provide a more precise filtering of particles of the conductive powder.

In operation 112, the conductive powder is dispersed in a fluid. In some embodiments, operation 112 is combined with operation 110 and the fluid is the solvent. In some embodiments, operation 112 is performed sequentially with operation 110. In some embodiments, the fluid is different from the solvent. In some embodiments, the fluid is a same material as the solvent. The fluid has a low metal oxidation rate. In some embodiments, the fluid includes methane, acetone, isopropyl alcohol, acetone, ethyl acetate or another suitable fluid. In some embodiments, an emulsifying agent is included in the fluid. In some embodiments, the emulsifying agent is omitted. The fluid is used to suspend the conductive powder to assist with application of the conductive powder to a semiconductor device. In some embodiments, a different fluid is used for different size particles of the conductive powder. For example, in some embodiments, a smallest size of particles following operation 110 is dispersed in a first fluid while a larger size of particles is dispersed in a second fluid different from the first fluid.

The fluid is directed into a container storing the conductive powder at a sufficiently low flow rate to prevent scattering of the particles of the conductive powder. As the size of the particles of the conductive powder decreases, the flow rate of the fluid also decreases.

In optional operation 114, the particles of the conductive powder having a diameter above a threshold value are recycled through method 100. In some embodiments, the threshold value is 5 μm. In some embodiments, the particles having the diameter greater than the threshold value are removed from a solvent by evaporating the solvent. In some embodiments, operation 114 is omitted and particles having a diameter above the threshold value are directed to a process which has a higher tolerance for particle size, such as a process for a larger technology node.

In some embodiments, an order of operations of method 100 is altered. For example, in some embodiments, operation 112 occurs before operation 110. In some embodiments, at least two operations of method 100 are performed simultaneously. For example, in some embodiments operation 106 is performed simultaneously with operation 104. In some embodiments, at least one operation of method 100 is omitted. For example, in some embodiments, operation 114 is omitted as discussed above.

Figure 2:
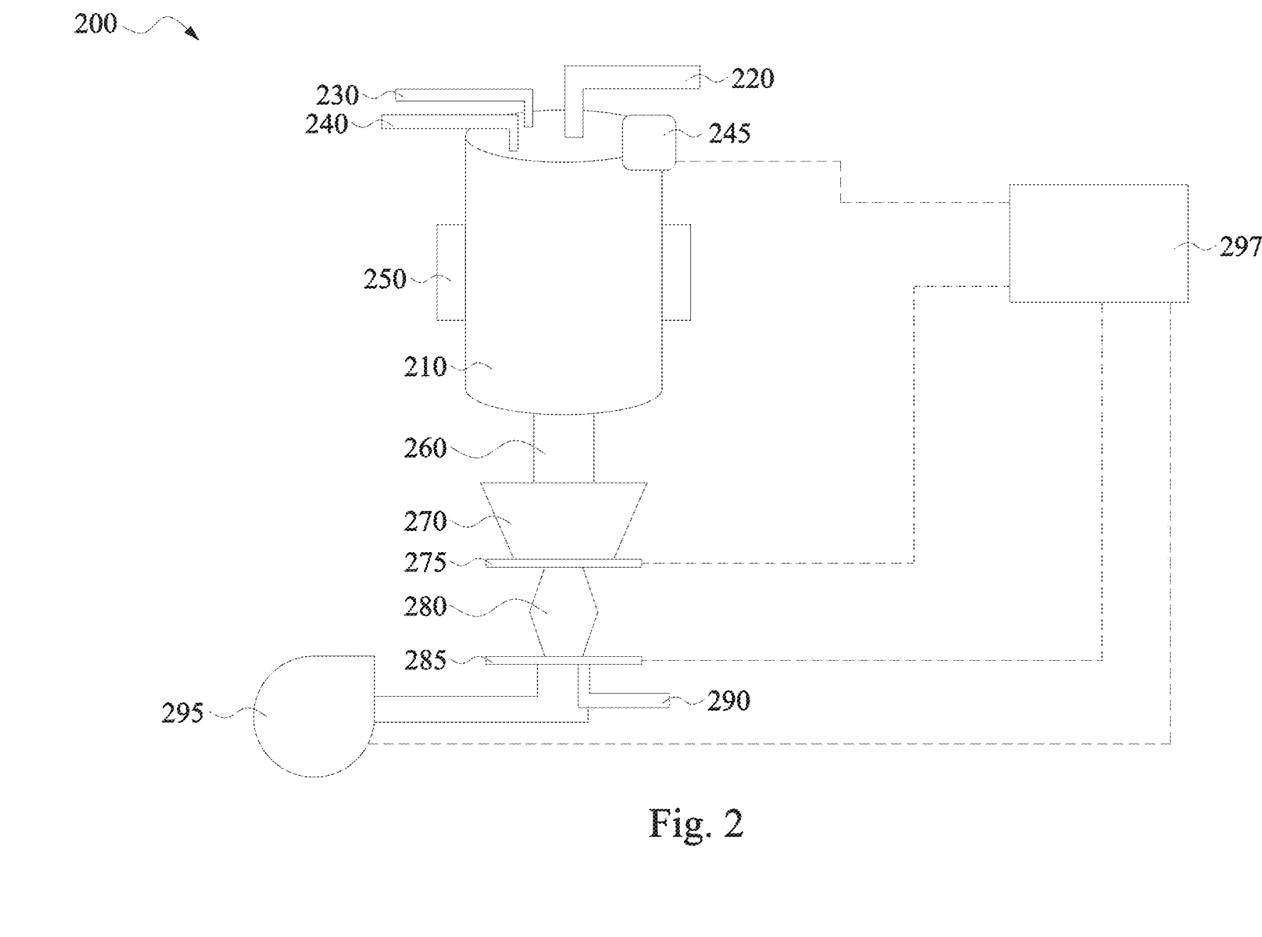
FIG. 2 is a schematic diagram of a device for forming a conductive powder in accordance with some embodiments.

FIG. 2 is a schematic diagram of a device 200 for forming a conductive powder in accordance with some embodiments. Device 200 includes a reaction chamber 210. A conductive powder precursor gas input 220; an inert gas input 230; and a hydrogen gas input 240 are connected to separate ports in reaction chamber 210. An RF power unit 245 is configured to ignite a plasma of the inert gas and the hydrogen gas to interact with the conductive powder precursor gas. A vibration unit 250 is attached to an outer surface of reaction chamber 210. A cooling section 260 is located at an output of reaction chamber 210 in order to cool the conductive powder formed in the reaction chamber. A collector 270 is configured to collect the conductive powder exiting reaction chamber 210 after passing through cooling section 260. Powder collecting cells 280 is configured to receive the conductive powder from collector 270 and to help separate the conductive powder based on particle diameter. A valve 275 is between collector 270 and powder collecting cells 280 in order selectively permit the conductive powder to transfer from collector 270 to powder collecting cells 280. A solvent supply line 290 is configured to supply a solvent for dispersing the conductive powder in powder collecting cells 280. A pump 295 is configured to help remove conductive powder from powder collecting cells 280. A valve 285 is between powder collecting cells 280 and each of solvent supply line 290 and pump 295 in order to selectively permit solvent to enter powder collecting cells 280 and selectively permit removal of conductive powder from powder collecting cells 280. A controller 297 is configured to control components of device 200 in order to produce the conductive powder.

Reaction chamber 210 is configured to receive conductive powder precursor gas from conductive powder precursor gas input 220; inert gas from inert gas input 230; and hydrogen gas from hydrogen gas input 240. In some embodiments, reaction chamber 210 includes a region for preheating the conductive powder precursor gas prior to interaction with the hydrogen gas or inert gas. In some embodiments, reaction chamber 210 includes preheated conductive powder precursor gas. RF power unit 245 is configured to ignite the hydrogen gas and the inert gas in order to form a plasma. Reaction chamber 210 is configured to direct the preheated conductive powder precursor gas to interact with the plasma. The plasma performs a reduction reaction with the preheated conductive powder precursor gas in order to form a conductive powder. In some embodiments, a pressure in reaction chamber 210 during the reaction of the preheated conductive powder precursor gas ranges from about 10 mTorr to about 20 Torr. The pressure in reaction chamber 210 helps to determine an amount of reactant materials within the reaction chamber to help control a rate of reaction. Sidewalls of reaction chamber 210 are coated with graphene in order to reduce adherence of the conductive powder and by-products of the reaction on the sidewalls. Vibration unit 250 also helps to reduce adherence of conductive powder and by-products on sidewalls of reaction chamber 210.

Conductive powder precursor gas input 220 is configured to convey conductive powder precursor gas from a supply to reaction chamber 210. In some embodiments, the conductive powder to be formed using device 200 includes aluminum, cobalt, copper, gold, magnesium, nickel, silver, titanium, zinc, alloys thereof or other suitable conductive material. In some embodiments, the conductive powder precursor gas includes a conductive-material organic compound. In some embodiments, the conductive powder precursor gas includes a conductive-material halide compound. In some embodiments, a heater is connected to conductive powder precursor gas input 220 in order to preheat the conductive powder precursor gas. In some embodiments, the heater includes a heat exchanger, an electric heater or another suitable heater. The conductive powder precursor gas is preheated to a temperature below a decomposition temperature of the conductive powder precursor gas. In some embodiments, the conductive powder precursor gas is heated to a temperature ranging from about 100° C. to about 600° C. Conductive powder precursor gas input 220 is connected to a separate port in reaction chamber 210 from inert gas input 230 and hydrogen gas input 240. In some embodiments, conductive powder precursor gas input 220 is connected to a same port in reaction chamber 210 as at least one of inert gas input 230 or hydrogen gas input 240.

Inert gas input 230 is configured to provide an inert gas from an inert gas supply to reaction chamber 210. In some embodiments, the inert gas for forming the inert gas plasma includes nitrogen gas, argon, helium or another suitable inert gas. Inert gas input 230 is connected to a separate port of reaction chamber 210 from conductive powder precursor gas input 220 and hydrogen gas input 240. In some embodiments, inert gas input 230 shares a port of reaction chamber 210 with at least one of conductive powder precursor gas input 220 or hydrogen gas input 240.

Hydrogen gas input 240 is configured to provide hydrogen gas from a hydrogen gas supply to reaction chamber 210. Hydrogen gas input 240 is connected to a separate port of reaction chamber 210 from conductive powder precursor gas input 220 and inert gas input 230. In some embodiments, hydrogen gas input 240 shares a port of reaction chamber 210 with at least one of conductive powder precursor gas input 220 or inert gas input 230.

RF power unit 245 is configured to ignite the hydrogen gas and the inert gas in order to form a plasma. An RF power applied in the reaction chamber depends on a volume of the reaction chamber. As the volume of the reaction chamber increases, the RF power applied in the reaction chamber also increases. In some embodiments, the RF power unit applies from about 10 W to about 300 kW to reaction chamber 210.

Vibration unit 250 is configured to provide vibration to reaction chamber 210. In some embodiments, the vibration unit 250 provides ultrasonic vibration to reaction chamber 210. The vibration of reaction chamber 210 helps to reduce an amount of conductive powder or reaction by-products that adhere to sidewalls of reaction chamber 210. In some embodiments, vibration unit 250 includes a transducer on an outer surface of reaction chamber 210. In some embodiments, vibration unit 250 includes a gas flowing through a channel or rotating a bearing within a chamber.

Cooling section 260 is configured to cool the conductive powder formed by the reaction in reaction chamber 210. In some embodiments, cooling section 260 exposes the conductive powder to air from an ambient environment. In some embodiments, cooling section 260 includes a heat exchanger. In some embodiments, cooling section 260 includes a circulation device configured to circulate a cooling material, e.g., air, through the conductive powder exiting reaction chamber 210.

Collector 270 is configured to receive the cooled conductive powder from cooling section 260. Collector 270 is configured to funnel the conductive powder to powder collecting cells 280. In some embodiments, collector 270 includes filters configured to filter the conductive powder based on particle size. In some embodiments, collector 270 is configured to receive a cleaning solution in order to remove reaction by-products from the conductive powder.

Valve 275 is configured to selectively permit the conductive powder to pass from collector 270 to powder collecting cells 280. In some embodiments, valve 275 includes a plurality of valves. In some embodiments, each valve of the plurality of valves corresponds to a single powder collecting cell of powder collecting cells 280. In some embodiments, each valve of the plurality of valves corresponds to a group of powder collecting cells of powder collecting cells 280. In some embodiments, valve 275 is controlled to permit passage of the conductive powder in response to a filtering process in collector 270. In some embodiments, valve 275 is controlled to permit passage of the conductive powder based on a status of powder collecting cells 280, e.g., powder collecting cells 280 receiving solvent or powder collecting cells 280 being full.

Powder collecting cells 280 are configured to receive the conductive powder and help to separate the conductive powder based on particle size. In some embodiments, each powder collecting cell of powder collecting cells 280 is configured to receive particles of the conductive powder having a specific particle diameter range. For example, in some embodiments, a first group of powder collecting cells is configured to receive particles of the conductive powder having a diameter below a threshold value and a second group of powder collecting cells is configured to receive particles of the conductive powder having a diameter equal to or greater than the threshold value. In some embodiments, powder collecting cells 280 include an ESC to direct the conductive powder into powder collecting cells. In some embodiments, powder collecting cells 280 include a vacuum pump to pull the conductive powder into powder conductive cells. In some embodiments, powder collecting cells 280 includes at least one filter. In some embodiments, powder collecting cells 280 includes an agitation device configured to help disburse the conductive powder in the solvent.

Valve 285 is configured to permit solvent from solvent inlet 290 to enter powder collecting cells 280. Valve 285 is also configured to selectively permit the conductive powder to pass from powder collecting cells 280 to an output connected to pump 295. In some embodiments, valve 285 includes a plurality of valves. In some embodiments, a first valve is connected to solvent inlet 290 and a second valve is connected to pump 295. In some embodiments, valve 285 is controlled to permit passage of the conductive powder in response to the conductive powder being sufficiently disbursed in the solvent. In some embodiments, valve 285 is controlled to permit passage of the solvent based on a status of valve 275, e.g., valve 275 being closed.

Solvent inlet 290 is configured to provide a solvent from a solvent supply to powder collecting cells 280 through valve 285. The solvent is used to disperse the conductive powder collected in the powder collecting cells 280. In some embodiments, the solvent includes methane, isopropyl alcohol, acetone, ethyl acetate or another suitable fluid. In some embodiments, the solvent includes more than one material. In some embodiments, solvent inlet 290 includes multiple inlets, e.g., one for each material of the solvent.

Pump 295 is configured to remove the conductive powder from powder collecting cells 280 through valve 285. Pump 295 is capable of removing the conductive powder dispersed in solvent from solvent inlet 290. In some embodiments, pump 295 is capable of removing the conductive powder in a non-dispersed state. In some embodiments, pump 295 includes a vacuum pump. In some embodiments, pump 295 includes a positive displacement pump. In some embodiments, pump 295 is configured to transport the conductive powder, in a dispersed state or non-dispersed state, to a container for later use.

Controller 297 is configured to control components of device 200. Controller 297 helps device 200 to operate efficiently in order to produce a conductive powder. Controller 297 is configured to control an open and closed status of valve 275 and valve 285. In some embodiments, controller 297 is capable of controlling individual valves within valve 275 and/or valve 285 independently. Controller 297 is configured to control RF power unit 245 in order to maintain a plasma within reaction chamber 210 during formation of the conductive powder. Controller 297 is configured to control pump 295 in order to regulate removal of the conductive powder from powder collecting cells 280. In some embodiments, controller 297 is also configured to control a flow rate of at least one of conductive powder precursor gas input 220, inert gas input 230, hydrogen gas input 240 or solvent inlet 290. In some embodiments, the flow rates are controlled by controlling valves within the various inputs and/or inlet. In some embodiments, the flow rate is controlled by controlling a pressure in the various inputs and/or inlet. In some embodiments, controller 297 controls vibration unit 250 in order to begin vibration of reaction chamber 210 when conductive powder is produced and cease vibration of the reaction chamber when the reaction chamber is not in use. In some embodiments, controller 297 controls temperature or pressure within reaction chamber 210. In some embodiments, controller 297 controls a heater connected to conductive powder precursor gas input 220 in order to control a preheat temperature of the conductive powder precursor gas.

In some embodiments, device 200 is used to implement method 100. In some embodiments, device 200 is used to produce conductive powder in a manner different from method 100.

Figure 3:
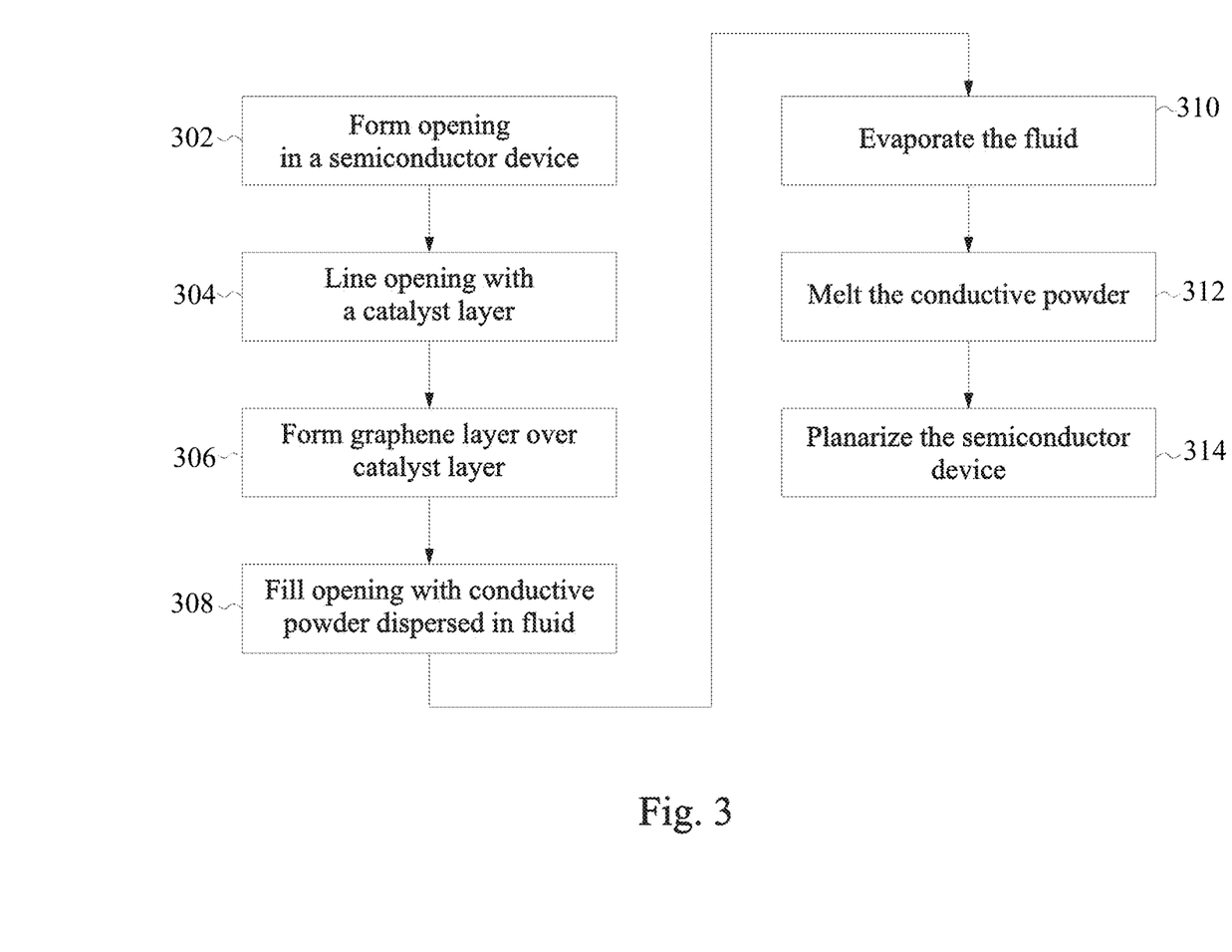
FIG. 3 is a flowchart of a method of forming a semiconductor device in accordance with some embodiments.

FIG. 3 is a flowchart of a method 300 of forming a semiconductor device in accordance with some embodiments. In operation 302, an opening is formed in the semiconductor device. In some embodiments, the opening is formed using an etching process, e.g., a wet etching or a dry etching. In some embodiments, the opening is formed using a laser drilling process or another suitable process. The opening extends through a dielectric material and exposes a conductive element or a contact region of a component of the semiconductor device. In some embodiments, the dielectric material is silicon oxide, silicon nitride, silicon oxynitride or another suitable dielectric material. A melting temperature of the dielectric material is greater than a melting temperature of a conductive powder used to fill the opening in the dielectric material.

In operation 304, the opening is lined with a catalyst layer. In some embodiments, the catalyst layer includes cobalt, nickel, titanium or another suitable catalyst material. In some embodiments, the catalyst layer is formed using chemical vapor deposition (CVD), physical vapor deposition (PVD), atomic layer deposition (ALD), plating or another suitable formation process.

In operation 306, a graphene layer is formed over the catalyst layer. In some embodiments, the graphene is formed using CVD, PVD or another suitable formation method. In some embodiments, a thickness of the graphene ranges from about 5 nm to about 100 nm.

In operation 308, a remaining portion of the opening is filled with a conductive powder dispersed in a fluid. In some embodiments, the conductive powder is suspended in the fluid by vibrating. The fluid containing the suspended conductive powder is spread, e.g., by spin coating, the fluid upon wafer to fill in the opening. In some embodiments, the conductive powder is dispersed in a solvent. The remaining portion of the opening is filled by flowing the fluid containing the dispersed conductive powder over the semiconductor device. The fluid will flow into the opening and carry the conductive powder into the opening. In some embodiments, an average size of the particles of the conductive powder is less than 10 nm. In some embodiments, an average size of the particles of the conductive powder ranges from about 1 nm to about 5 μm. As a particle size increases, filling the opening becomes more difficult, in some instances. As a particle size decreases, a risk of the particles of the conductive powder failing to fill the opening increases, in some instances.

In operation 310, the fluid is evaporated. Evaporating the fluid removes the fluid from the opening and leaves behind only the conductive powder over the graphene layer. In some embodiments, the fluid is evaporated using heat. In some embodiments, the fluid is evaporated by reducing a pressure above the semiconductor device.

In operation 312, the conductive powder is melted. Melting the conductive powder helps to form a uniform distribution of conductive material in the opening in order to help ensure electrical connection to an element exposed by the opening. In some embodiments, the conductive powder is melted using an anneal process. In some embodiments, the anneal process is a laser anneal process. In some embodiments, the laser is a continuous wave (CW) laser. The laser is scanned over a surface of the semiconductor device and melts the conductive powder exposed to the radiation from the laser. In some embodiments, the laser is scanned over the surface of the semiconductor device by using optical elements to change a direction of the laser with respect to the semiconductor device. In some embodiments, the laser remains stationary and the semiconductor device is moved with respect to the laser, for example using a stepper motor. In some embodiments, both the laser and the semiconductor device are moved either sequentially or simultaneously. In some embodiments, the laser is scanned over the semiconductor device in a two-dimensional scan. In some embodiments, the laser is scanned over the semiconductor device in a one-dimensional scan.

In some embodiments, a speed of the laser scan across the surface of the semiconductor device ranges from about 10 cm/min to about 30 cm/min. As a speed of the laser scan increases, a risk of incomplete melting of the conductive powder increases, in some instances. As the speed of the laser scan decreases, a risk of damage to other components in the semiconductor device increases, in some instances. In some embodiments, a width of the laser contacting the semiconductor device in a scanning direction ranges from about 0.3 cm to about 0.5 cm. As a width of the laser increases, precision in the control of the laser is reduced, in some instances. As the width of the laser decreases, a production time for the semiconductor device increases, in some instances. In some embodiments, a width of the laser contacting the semiconductor device in a direction perpendicular to the scanning direction ranges from about 4 cm to about 6 cm. As a width of the laser increases, precision in the control of the laser is reduced, in some instances. As the width of the laser decreases, a production time for the semiconductor device increases, in some instances.

In operation 314, the semiconductor device is planarized. Planarizing the semiconductor device removes a portion of the melted conductive powder outside of the opening. Also, a portion of the graphene layer and the catalyst layer outside the opening are removed by planarizing the semiconductor device. In some embodiments, a chemical mechanical polishing (CMP) process is used to planarize the semiconductor device. In some embodiments, a grinding process, an etching process or another suitable process is used to planarize the semiconductor device.

Method 300 is able to fill an opening having a smaller dimension than other processes. For example, method 300 is able to fill openings for 10 nm technology nodes and lower because the particles size of the conductive powder is small and the conductive powder is dispersed in the fluid, which helps to move the conductive powder into the opening. A carbon content of the conductive material formed using method 300 is also reduced in comparison with other approaches. For example, a conductive line formed by electro copper plating (ECP) has a carbon content greater than 50 parts per million (ppm). In contrast, a conductive line formed by method 300 has a carbon content less than 50 ppm, in some instances. Carbon will increase the resistance of the conductive line above the resistance of pure copper. The increase in resistance increases heat generated by operating the semiconductor device, slows signal transfer and reduces precision of signal transfer. Reducing the carbon content in the conductive line helps to form a semiconductor device which will operate as designed and produce less heat in comparison with a semiconductor device having a higher carbon content in the conductive lines.

In some embodiments, at least two operations of method 300 are performed simultaneously. For example, in some embodiments operation 310 is performed simultaneously with operation 312. In some embodiments, at least one operation of method 300 is omitted. For example, in some embodiments, operation 314 is omitted.

Figure 4A:
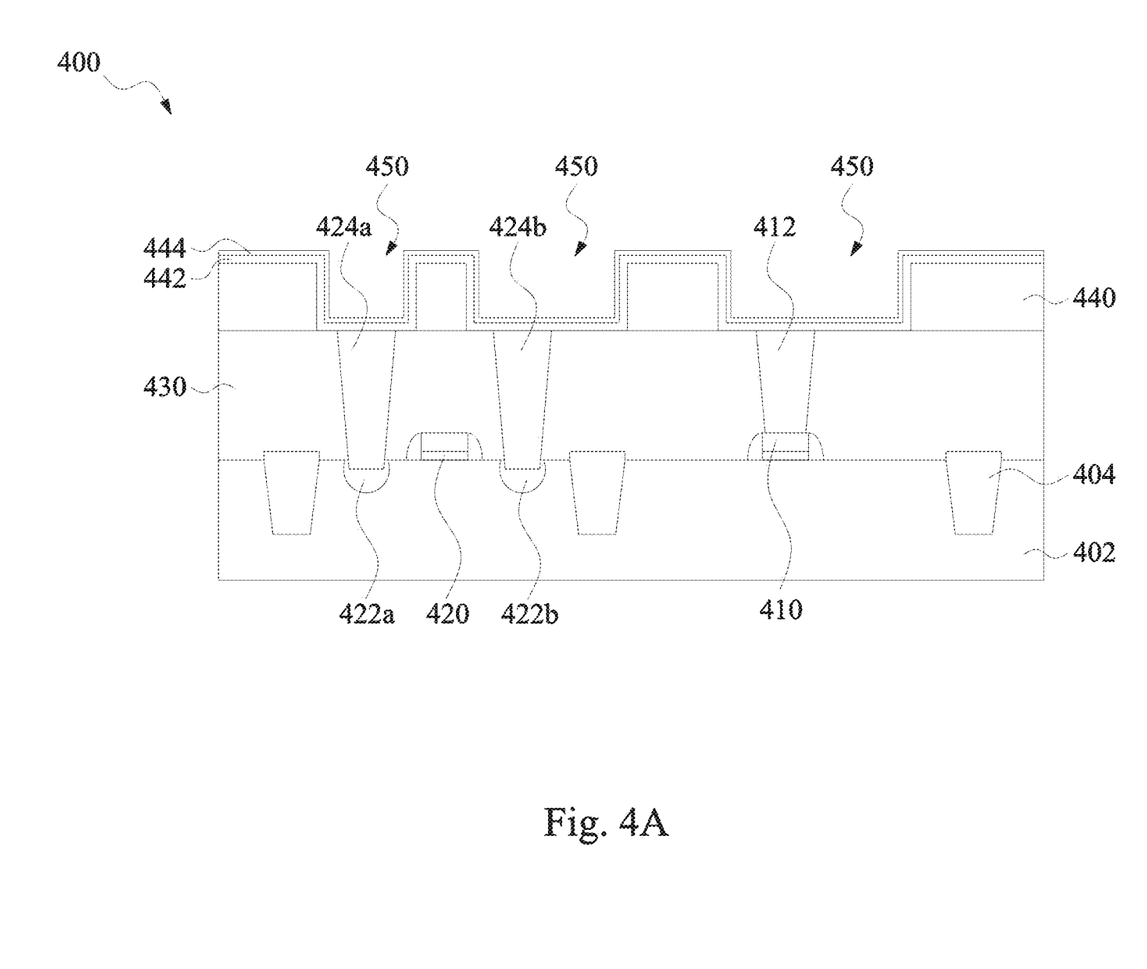
FIGS. 4A, 4B, 4C and 4D are cross-sectional views of a semiconductor device at various stages of manufacture in accordance with some embodiments.

FIG. 4A is a cross-sectional view of a semiconductor device 400 following formation of a graphene layer in openings in accordance with some embodiments. In some embodiments, semiconductor device 400 is a semiconductor device after operation 306 of method 300 (FIG. 3). Semiconductor device 400 includes a substrate 402. A plurality of isolation features 404 are in substrate 402. A plurality of transistors 410 are on substrate 402. Each transistor 410 includes a channel region 420 in substrate 402 between a source region 422a and a drain region 422b. A gate contact 412 extends from a gate of one of the transistors 410 and is electrically connected to the gate. A source contact 424a extends from source region 422a and is electrically connected to the source. A drain contact 424b extends from drain region 422b and is electrically connected to the drain. An inter-layer dielectric (ILD) 430 is over substrate 402. Gate contact 412, source contact 424a and drain contact 424b extend through ILD 430. A dielectric layer 440, e.g., an inter-metal dielectric (IMD) layer, is over ILD 430. A plurality of openings 450 are in dielectric layer 440. A catalyst layer 442 lines dielectric layer 440 including sidewalls and bottom surfaces of openings 450. A graphene layer 444 is over catalyst layer 442.

One of ordinary skill in the art would recognize that a gate contact would also be formed for more than one transistor 410, in some embodiments. Additionally, source/drain contacts would also be formed for more than one transistor 410, in some embodiments. The arrangement of semiconductor device 400 omits some features, such as additional gate contacts and source/drain contacts, for the sake of clarity.

Openings 450 are formed in a metal layer directly over a layer containing contacts, e.g., gate contact 412, source contact 424a and drain contact 424b. In some embodiments, the metal layer formed in dielectric layer 440 is called metal layer 1 or M1. In some embodiments, openings 450 are formed in ILD 430 and expose a gate or source/drain regions of a transistor. In some embodiments, the metal layer formed in ILD 430 is called metal layer 0 or M0. In some embodiments, openings 450 are in a metal layer farther from substrate 402 than M1.

Figure 4B:
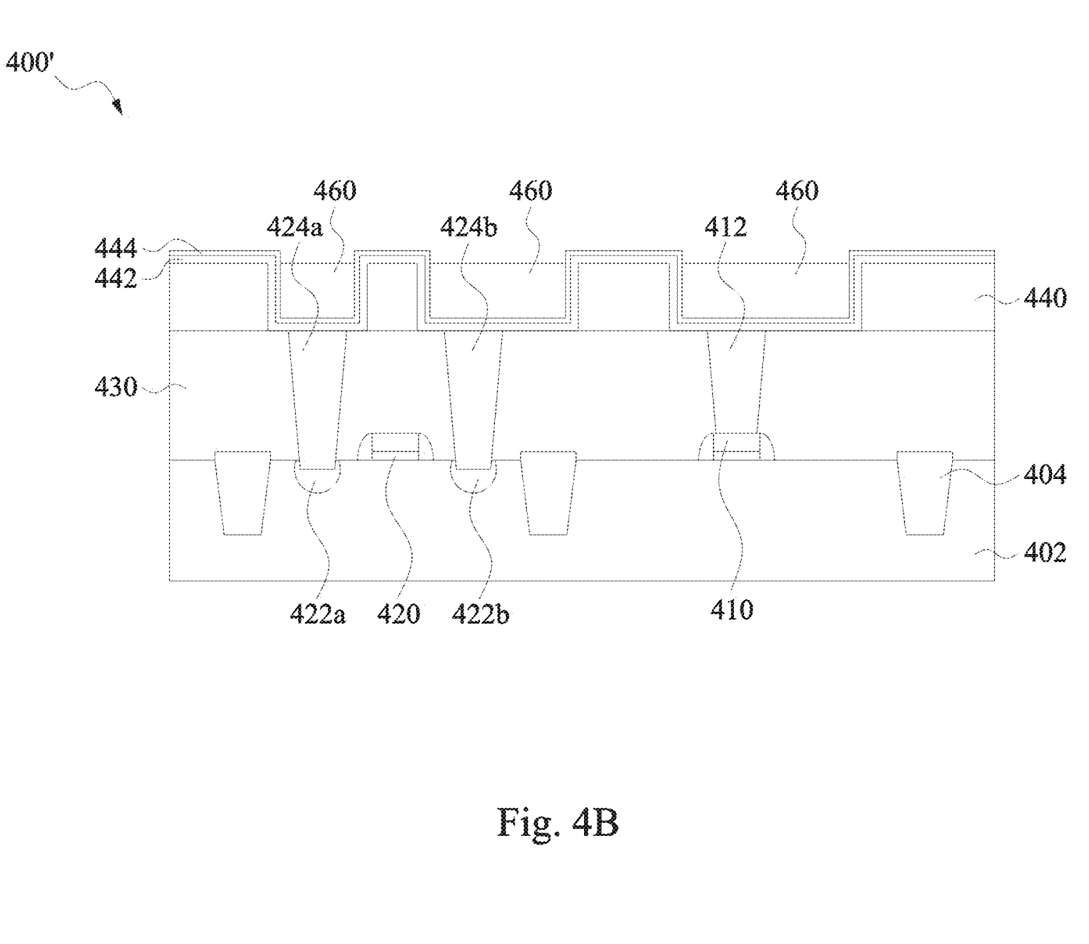

FIG. 4B is a cross-sectional view of a semiconductor device 400' following formation filling openings with a conductive powder in accordance with some embodiments. In some embodiments, semiconductor device 400' is a structure following operation 308 of method 300 (FIG. 3). Semiconductor device 400' is similar to semiconductor device 400 and same reference numbers refer to same elements. In comparison with semiconductor device 400, semiconductor device 400' includes conductive powder 460 in openings 450. In some embodiments, conductive powder 460 is dispersed in a fluid. In some embodiments, conductive powder 460 is in a non-dispersed state. In some embodiments, the conductive powder includes aluminum, cobalt, copper, gold, magnesium, nickel, silver, titanium, zinc, alloys thereof or other suitable material.

Figure 4C:
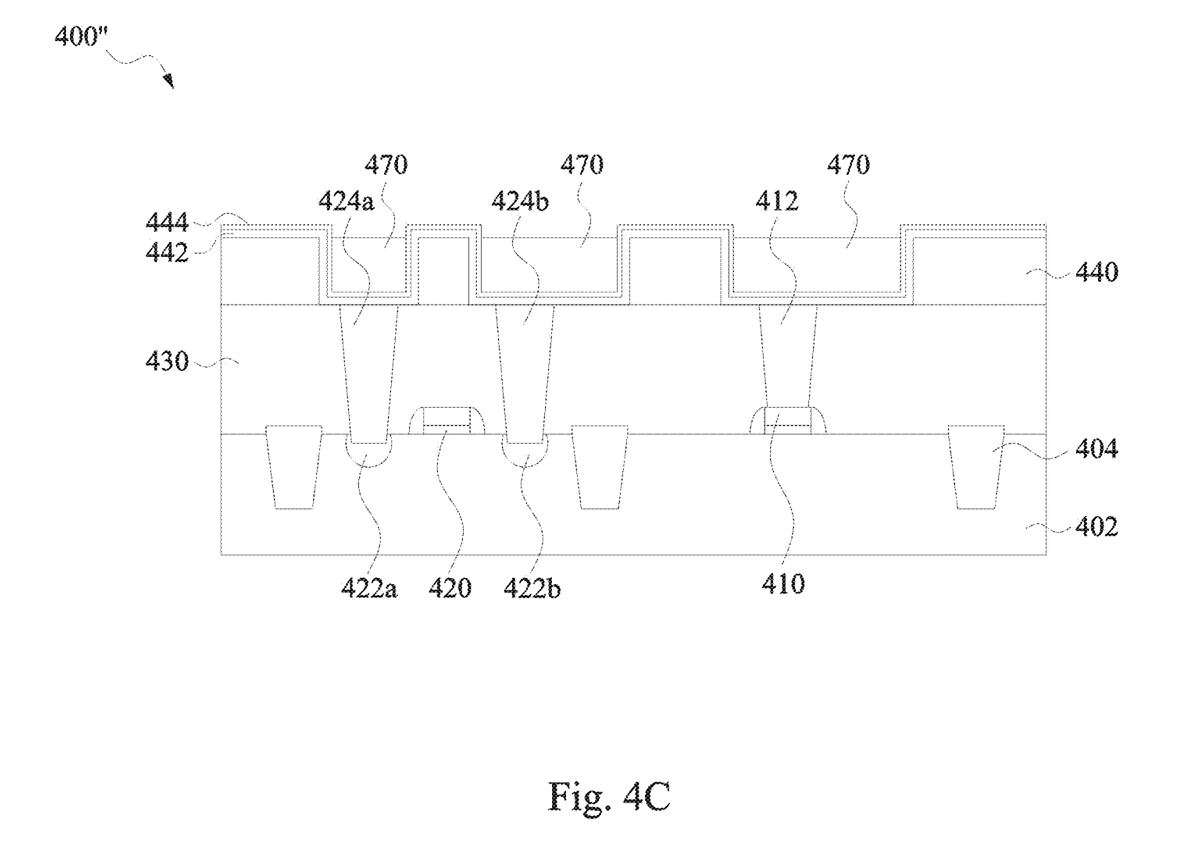

FIG. 4C is a cross-sectional view of a semiconductor device 400" following formation melting of conductive powder in accordance with some embodiments. In some embodiments, semiconductor device 400" is a structure following operation 312 of method 300 (FIG. 3). Semiconductor device 400" is similar to semiconductor device 400' and same reference numbers refer to same elements. In comparison with semiconductor device 400', semiconductor device 400" includes a conductive material 470 in openings 450. Conductive material 470 includes a same material as conductive powder 460. In comparison with conductive powder 460, conductive material 470 includes fewer interfaces. Conductive material 470 is formed by melting conductive powder 460, e.g., by a laser annealing process.

Figure 4D:
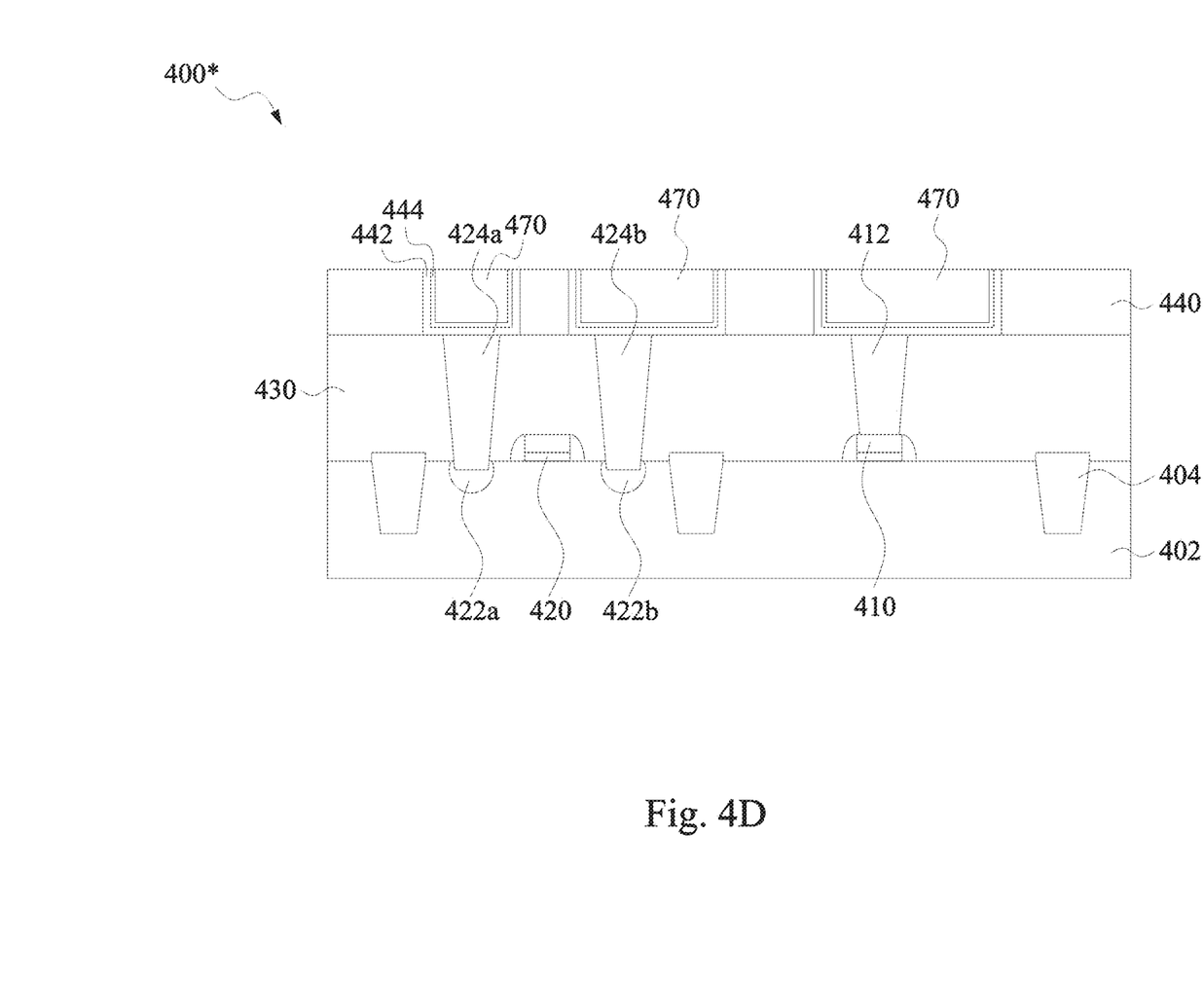

FIG. 4D is a cross-sectional view of a semiconductor device 400\* following a planarization process in accordance with some embodiments. In some embodiments, semiconductor device 400\* is a structure following operation 314 of method 300 (FIG. 3). Semiconductor device 400\* is similar to semiconductor device 400" and same reference numbers refer to same elements. In comparison with semiconductor device 400", semiconductor device 400\* includes a top surface of dielectric layer 440 exposed. A planarization process, e.g., CMP, was used to remove catalyst layer 442, graphene layer 444 and conductive material 470 outside of openings 450. The planarization process produces a top surface of dielectric layer 440 which is substantially coplanar with a top surface of conductive material 470.

A carbon content of conductive material 470 is less than 50 ppm. The low carbon content of conductive material 470 helps to maintain a low resistance of conductive material 470 in comparison with other devices.

Figure 5:
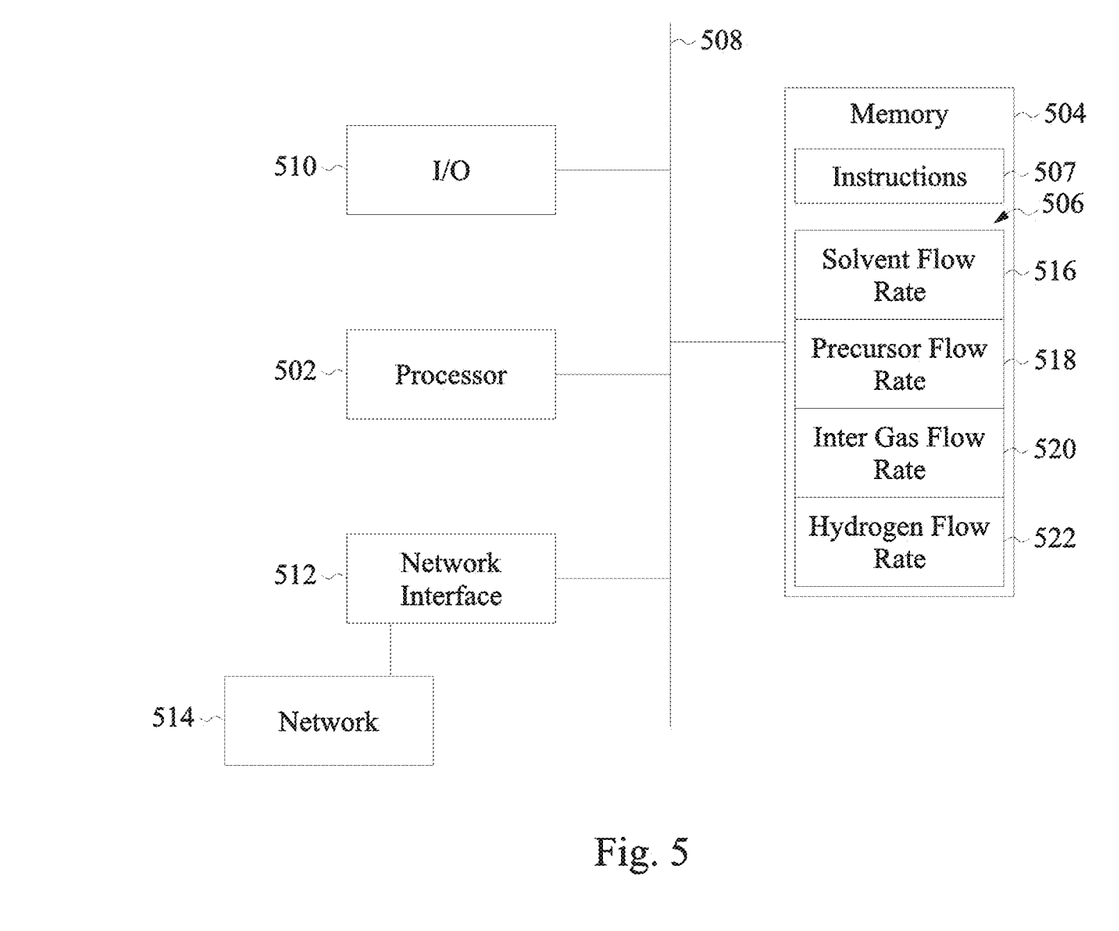
FIG. 5 is a schematic view of a controller for controlling a device for forming a conductive powder in accordance with some embodiments.

FIG. 5 is a schematic view of a controller 500 for controlling a device for forming a conductive powder in accordance with some embodiments. Controller 500 includes a hardware processor 502 and a non-transitory, computer readable storage medium 504 encoded with, i.e., storing, the computer program code 506, i.e., a set of executable instructions. Computer readable storage medium 504 is also encoded with instructions 507 for interfacing with manufacturing machines for producing the conductive powder. The processor 502 is electrically coupled to the computer readable storage medium 504 via a bus 508. The processor 502 is also electrically coupled to an I/O interface 510 by bus 508. A network interface 512 is also electrically connected to the processor 502 via bus 508. Network interface 512 is connected to a network 514, so that processor 502 and computer readable storage medium 504 are capable of connecting to external elements via network 514. The processor 502 is configured to execute the computer program code 506 encoded in the computer readable storage medium 504 in order to cause controller 500 to be usable for performing a portion or all of the operations as described in method 100.

In some embodiments, the processor 502 is a central processing unit (CPU), a multi-processor, a distributed processing system, an application specific integrated circuit (ASIC), and/or a suitable processing unit.

In some embodiments, the computer readable storage medium 504 is an electronic, magnetic, optical, electromagnetic, infrared, and/or a semiconductor system (or apparatus or device). For example, the computer readable storage medium 504 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the storage medium 504 stores the computer program code 506 configured to cause controller 500 to perform method 100. In some embodiments, the storage medium 504 also stores information needed for performing a method 100 as well as information generated during performing the method 100, such as a solvent flow rate parameter 516, a precursor flow rate parameter 518 for monitoring a flow rate of a conductive powder precursor gas flow rate, an inert gas flow rate parameter 520, hydrogen gas flow rate parameter 522 and/or a set of executable instructions to perform the operation of method 100.

In some embodiments, the storage medium 504 stores instructions 507 for interfacing with manufacturing machines. The instructions 507 enable processor 502 to generate manufacturing instructions readable by the manufacturing machines to effectively implement method 100 during a manufacturing process.

Controller 500 includes I/O interface 510. I/O interface 510 is coupled to external circuitry. In some embodiments, I/O interface 510 includes a keyboard, keypad, mouse, trackball, trackpad, and/or cursor direction keys for communicating information and commands to processor 502.

Controller 500 also includes network interface 512 coupled to the processor 502. Network interface 512 allows controller 500 to communicate with network 514, to which one or more other computer systems are connected. Network interface 512 includes wireless network interfaces such as BLUETOOTH, WIFI, WIMAX, GPRS, or WCDMA; or wired network interface such as ETHERNET, USB, or IEEE-1394. In some embodiments, method 100 is implemented in two or more controllers 500, and information such as memory type, memory array layout, I/O voltage, I/O pin location and charge pump are exchanged between different controllers 500 via network 514.

The above description includes some embodiments for forming a conductive powder having sufficiently small particle size to fill openings for 10 nm technology nodes and smaller. The conductive powder is able to effectively fill openings for conductive lines or vias in a semiconductor device to increase reliability of the semiconductor device and production yield.

An aspect of this description relates to a method of forming a conductive powder. The method includes reducing, by a reduction reaction, a conductive powder precursor gas using a plasma to form the conductive powder. The method further includes filtering the conductive powder based on particle size. The method further includes dispersing a portion of the conductive powder having a particle size below a threshold value in a fluid. In some embodiments, the method further includes preheating the conductive powder precursor gas prior to the reducing of the conductive powder precursor gas. In some embodiments, the method further includes performing an ultrasonic vibration on a reaction chamber simultaneously with the reducing of the conductive powder precursor gas in the reaction chamber. In some embodiments, filtering of the conductive powder includes performing at least one of an electro-static collector (ESC) process or a centrifugal process. In some embodiments, dispersing of the conductive powder in the fluid includes dispersing the conductive powder in a fluid free of oxygen. In some embodiments, dispersing of the conductive powder in the fluid includes dispersing the conductive powder in a solvent including methane, acetone or isopropyl alcohol. In some embodiments, reducing of the conductive powder precursor gas includes reducing the conductive powder precursor gas comprising a conductive-material organic compound. In some embodiments, reducing of the conductive powder precursor gas includes reducing the conductive powder precursor gas comprising a conductive-material halide compound. In some embodiments, reducing of the conductive powder precursor gas includes reducing the conductive powder precursor gas in a reaction chamber at a pressure ranging from about 10 milliTorr (mTorr) to about 20 Torr, at a radio frequency (RF) power ranging from about 10 watts (W) to about 300 kilowatts (kW), and at a temperature ranging from about 100° C. to about 600° C.

An aspect of this description relates to a device for forming a conductive powder. The device includes a reaction chamber configured to receive a conductive powder precursor gas, an inert gas and a hydrogen gas. The device further includes a radio frequency (RF) power unit configured to ignite a plasma using the inert gas and the hydrogen gas, wherein the plasma is usable to reduce, by a reduction reaction, the conductive powder precursor gas to form the conductive powder. The device further includes powder collecting cells configured to separate the conductive powder based on particle size. The device further includes a solvent inlet configured to provide a solvent to the powder collecting cells for dispersing the conductive powder in a solvent. In some embodiments, the device further includes a vibration unit configured to vibrate the reaction chamber during reduction of the conductive powder precursor gas. In some embodiments, the device further includes a valve configured to regulate a flow of the solvent from the solvent inlet to the powder collecting cells. In some embodiments, the device further includes a pump for removing the conductive powder dispersed in the solvent from the powder collecting cells.

An aspect of this description relates to a method of forming a conductive powder. The method includes reducing, by a reduction reaction, a conductive powder precursor gas using a plasma to form the conductive powder in a reaction chamber. The method further includes vibrating the reaction chamber during the reducing. The method further includes filtering the conductive powder based on particle size. The method further includes dispersing a portion of the conductive powder having a particle size below a threshold value in a fluid. In some embodiments, the vibrating includes an ultrasonic vibrating. In some embodiments, the method further includes returning a portion of the conductive powder having a particle size equal to or greater than the threshold value to the reaction chamber. In some embodiments, the method further includes heating the conductive powder precursor gas prior to the reducing. In some embodiments, heating the conductive powder precursor gas includes heating the conductive powder precursor gas to a temperature below a decomposition temperature of the conductive powder precursor gas. In some embodiments, reducing the conductive powder precursor gas includes reducing a conductive-material organic compound. In some embodiments, reducing the conductive powder precursor gas includes reducing a conductive-material halide compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a conductive powder, the method comprising:
   reducing, by a reduction reaction, a conductive powder precursor gas using a plasma to form the conductive powder;
   filtering the conductive powder based on particle size;
   dispersing a portion of the conductive powder having a particle size below a threshold value in a fluid; and
   returning a portion of the conductive powder having a particle size equal to or greater than the threshold value to the reaction chamber.

2. The method of claim 1, further comprising preheating the conductive powder precursor gas prior to the reducing of the conductive powder precursor gas.

3. The method of claim 1, further comprising performing an ultrasonic vibration on a reaction chamber simultaneously with the reducing of the conductive powder precursor gas in the reaction chamber.

4. The method of claim 1, wherein the filtering of the conductive powder comprises performing at least one of an electro-static collector (ESC) process or a centrifugal process.

5. The method of claim 1, wherein the dispersing of the conductive powder in the fluid comprises dispersing the conductive powder in a fluid free of oxygen.

6. The method of claim 1, wherein the dispersing of the conductive powder in the fluid comprises dispersing the conductive powder in a solvent including methane, acetone or isopropyl alcohol.

7. The method of claim 1, wherein the conductive powder precursor gas comprises a conductive-material organic compound.

8. The method of claim 1, wherein the conductive powder precursor gas comprises a conductive-material halide compound.

9. The method of claim 1, wherein the reducing of the conductive powder precursor gas comprises reducing the conductive powder precursor gas in a reaction chamber at a pressure ranging from about 10 milliTorr (mTorr) to about 20 Torr, at a radio frequency (RF) power ranging from about 10 watts (W) to about 300 kilowatts (kW), and at a temperature ranging from about 100° C. to about 600° C.

10. A method of forming a conductive powder, the method comprising:
    reducing, by a reduction reaction, a conductive powder precursor gas using a plasma to form the conductive powder in a reaction chamber;
    vibrating the reaction chamber during the reducing;
    filtering the conductive powder based on particle size;
    dispersing a portion of the conductive powder having a particle size below a threshold value in a fluid; and
    returning a portion of the conductive powder having a particle size equal to or greater than the threshold value to the reaction chamber.

11. The method of claim 10, wherein the vibrating comprises an ultrasonic vibrating.

12. The method of claim 10, wherein returning the portion of the conductive powder to the reaction chamber comprises returning the portion of the conductive powder having a particle diameter equal to or greater than 5 microns (pa) to the reaction chamber.

13. The method of claim 10, further comprising heating the conductive powder precursor gas prior to the reducing.

14. The method of claim 13, wherein heating the conductive powder precursor gas comprises heating the conductive powder precursor gas to a temperature below a decomposition temperature of the conductive powder precursor gas.

15. The method of claim 10, wherein reducing the conductive powder precursor gas comprises reducing a conductive-material organic compound.

16. The method of claim 10, wherein reducing the conductive powder precursor gas comprises reducing a conductive-material halide compound.

17. A method of forming a conductive powder, the method comprising:
    reducing, by a reduction reaction, a conductive powder precursor gas using a plasma to form the conductive powder;
    filtering the conductive powder based on particle size;
    dispersing a first portion of the conductive powder in a fluid, wherein the first portion of the conductive powder has a particle size below a threshold value; and
    recycling a second portion of the conductive powder through the reducing, the filtering and the dispersing, wherein the second portion of the conductive powder has a particle size equal to or greater than the threshold value.

18. The method of claim 17, further comprising performing ultrasonic vibration on the conductive powder.

19. The method of claim 18, wherein filtering the conductive powder comprises filtering the conductive powder after performing the ultrasonic vibration.

* * * * *